United States Patent
Scholder et al.

[11] Patent Number: 6,031,725
[45] Date of Patent: Feb. 29, 2000

[54] METHOD AND APPARATUS FOR MOUNTING A MICROPROCESSOR MODULE IN A COMPUTER

[75] Inventors: Erica Scholder, Austin; Gilberto Hernandez, Pflugerville, both of Tex.

[73] Assignee: Dell U.S.A., L.P., Round Rock, Tex.

[21] Appl. No.: 08/959,184

[22] Filed: Oct. 28, 1997

[51] Int. Cl.⁷ .................................................... H05K 7/14
[52] U.S. Cl. ...................... 361/759; 361/756; 361/801; 361/802; 439/377; 439/573; 211/41.17
[58] Field of Search .................................. 206/706, 707, 206/708, 710, 711; 211/41.17; 361/732, 740, 741, 747, 756, 759, 801, 802; 439/330, 331, 377, 525, 526, 630, 573, 636

[56] References Cited

U.S. PATENT DOCUMENTS

| | | | |
|---|---|---|---|
| 3,246,279 | 4/1966 | Storcel | 439/377 |
| 3,662,224 | 5/1972 | Rauch | 361/756 |
| 3,932,016 | 1/1976 | Ammenheuser | 439/377 |
| 4,046,443 | 9/1977 | Champagne | 439/377 |
| 4,080,028 | 3/1978 | Gilbert | 439/377 |
| 4,080,031 | 3/1978 | Sawford-Atkins | 439/377 |
| 5,575,546 | 11/1996 | Radloff . | |
| 5,829,601 | 11/1998 | Yurchenco et al. | 211/41.17 |

OTHER PUBLICATIONS

U.S. Patent Application No. 08/409,764, filed on Aug. 22, 1996, Mills, Gandre, & Sands, Expansion Card Stabilizer For A Circuit Board Edge Connector, Abstract & 3 sheets of drawings.

U.S. Patent Application No. 08/144,457, filed on Oct. 28, 1993, Scholder et al., Adjustable Printed Circuit Board Mounting Apparatus, Abstract & 6 sheets of drawings.

U.S. Patent Application No. 08/967,836, filed on Nov. 11, 1997, Moss, Expansion Card Carrier and Method for a Computer System, Abstract and 7 sheets of drawings.

*Primary Examiner*—Leo P. Picard
*Assistant Examiner*—John B. Vigushin
*Attorney, Agent, or Firm*—Haynes & Boone, L.L.P.

[57] ABSTRACT

A computer having a retention module connected to the circuit board of the module for receiving a cartridge containing a microprocessor. The retention module has a base member for mounting to the chassis, and a retention member formed integrally with the base member for receiving a nut for engaging a post on the chassis to mechanically connect the retention module to the chassis. The retention member retains the nut and aligns the nut with the post when the retention module is placed on the chassis prior to the nut being threadedly connected to the post.

21 Claims, 3 Drawing Sheets

METHOD AND APPARATUS FOR MOUNTING A MICROPROCESSOR MODULE IN A COMPUTER

TECHNICAL FIELD

This application relates generally to the field of computers, and more particularly to a retention module and method for attaching a microprocessor module to a printed circuit board of a computer.

BACKGROUND

A great majority of computers on the market include one or more microprocessor modules that are mounted in the computer chassis in a manner so that they can be removed for replacement, repair or the like. To this end, to facilitate removal of the module, it is often housed in a cartridge assembly, or the like, which snaps into a molded plastic retention module that is attached to a printed circuit board of the computer. In these designs, the retention module is mechanically connected to the circuit board by one or more threaded posts that project upwardly from the board adjacent the connector. The retention module is lowered onto the circuit board and openings are provided in the base of the assembly for receiving the posts. Captive nuts are then torqued down over the threaded posts to complete the mechanical connection. Mating connectors are provided on the microprocessor module and the circuit board for establishing an electrical connection.

Since space is at a premium in this type of environment, to facilitate the installation the nuts are attached to the retention module and the retention module is lowered onto the chassis so as to align the nuts with the posts. The nuts can then easily be torqued down over the posts. According to one prior technique, clips are provided that clip the nuts onto the retention module. However, these clips do not necessarily keep their respective nuts aligned vertically along their axes. Therefore, when the retention module is lowered over the posts, the posts often engage a lower surface of the nut causing it to pop out of the clip. Also, this misalignment creates a potential for damage when a screwdriver, or the like, is brought into proximity of each nut for the purpose of torquing-down the nuts.

Therefore, what is needed is a retention module that connects to a printed circuit board of a computer for receiving a cartridge assembly for a microprocessor module, while maintaining the nuts in an aligned position during the assembly.

SUMMARY

Accordingly, an embodiment is directed to a computer having a retention module connected to the chassis of a computer for receiving a cartridge containing a microprocessor. The retention module includes a base member that is mounted to the chassis, and a retention member formed integrally with the base member for receiving a nut for engaging a post on the chassis to mechanically connect the retention module to the chassis. The retention member retains the nut and aligns the nut with the post when the retention module is placed on the chassis prior to the nut being threadedly connected to the post.

This gives rise to several advantages. For example, the nuts will be properly aligned with the threaded posts, thus assuring that the nuts can be easily torqued-down over the posts. Also, the module has fewer components thus reducing costs and lowering the risk for components being unavailable or out of specification. Also, the module and the method of the present invention require less labor which results in another cost saving. Further, the module and method of the present invention increase production speed and reduce damage, and therefore factory scrap.

DETAILED DESCRIPTION OF THE PREFERRED EMBODIMENT

Figure 1:
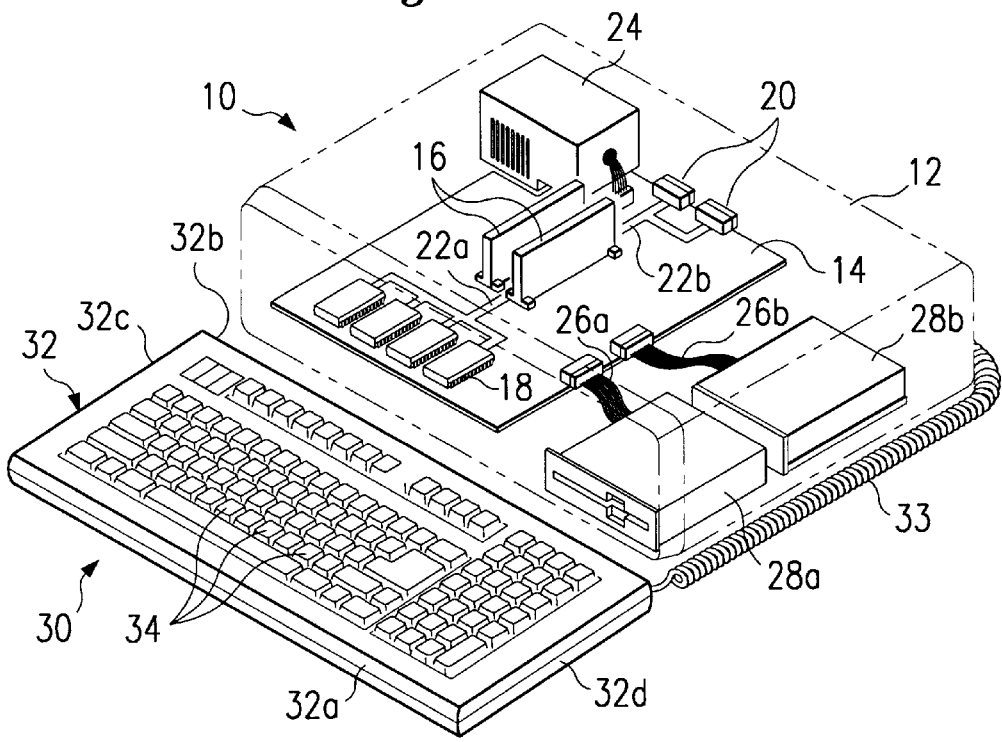
FIG. 1 is a schematic/isometric view of a computer according to an embodiment.

FIG. 1 of the drawings depicts a computing system which includes a computer 10 which can be in the form of a desktop computer, a tower computer, or the like. The computer 10 includes a chassis 12 (shown in phantom lines) in which a motherboard, in the form of a printed circuit board, 14 is mounted. Two microprocessor modules 16, four memory modules 18, and two input/output (I/O) devices 20 are mounted on the circuit board 14. The modules 18 and the devices 20 are mounted to the circuit board in a conventional manner and the method of mounting the microprocessor modules 16 to the circuit board 14 will be described in detail.

Two buses 22a and 22b are also provided on the circuit board 14 that connect the microprocessor 16 to the memory modules 18 and to the input/output devices 20, respectively. A power supply 24 is connected to the circuit board 14 and a pair of cable assemblies 26a and 26b connect the circuit board 14 to a disk drive unit 28a and a hard drive unit 28b, respectively. A keyboard 30 is connected to one of the input/output devices 20 by a cable 32. It is understood that other components, electrical traces, electrical circuits and related devices (not shown) are provided in the chassis 10. With the exception of the mounting of the microprocessor 16 to the circuit board 14, all of the above is conventional and therefore will not be described in any further detail.

Figure 2:
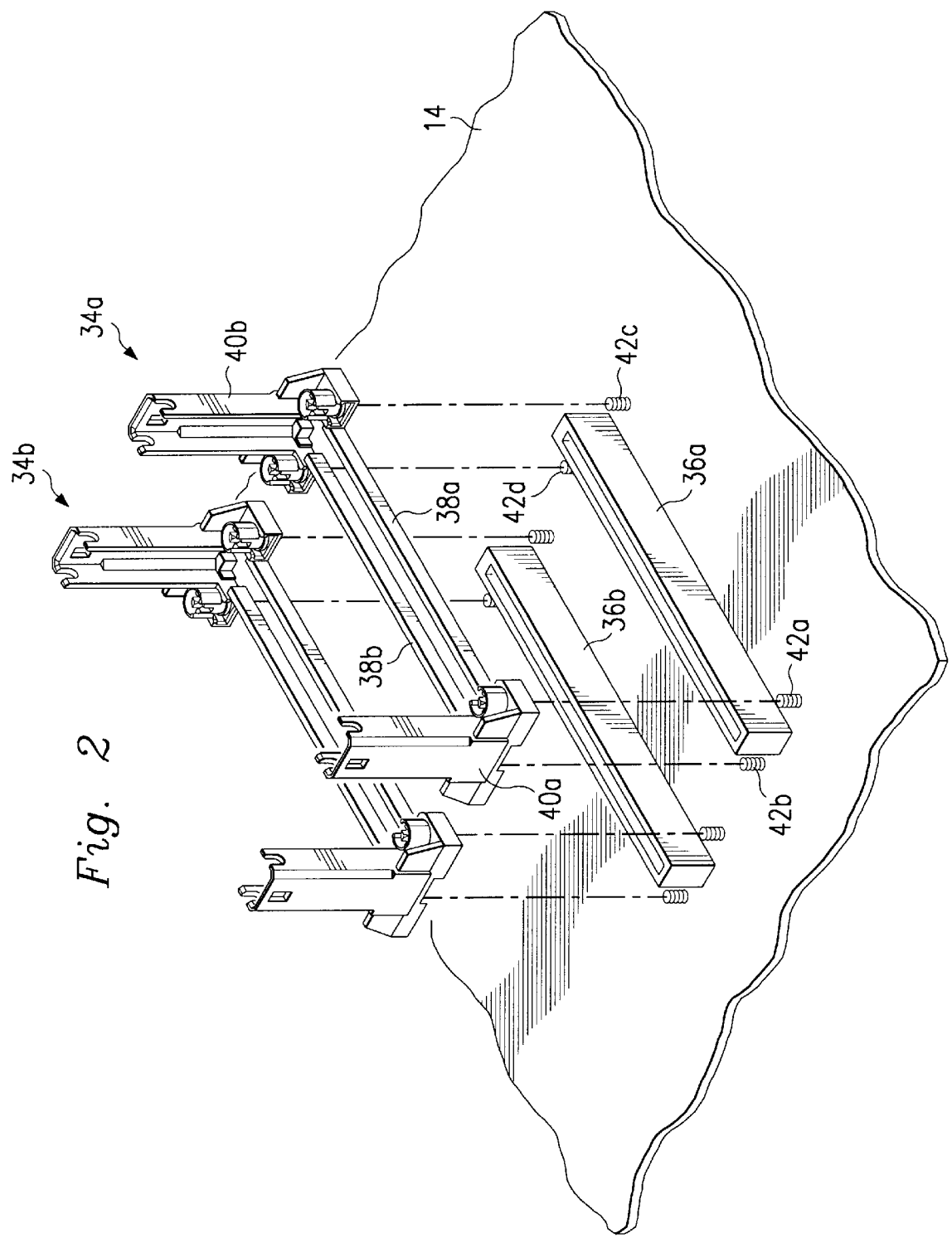
FIG. 2 is an enlarged, partial, isometric view of a portion of the printed circuit board of FIG. 1 depicting two retention modules.

As shown in FIG. 2, two retention modules 34a and 34b are provided for respectively connecting the processor modules 16 to the circuit board 14. To this end, two connectors 36a and 36b are attached to the circuit board 14 in any known manner and project upwardly from the circuit board, as viewed in FIG. 2. The connectors 36a and 36b are conventional and receive the retention modules 34a and 34b, respectively, in a manner to be described.

The retention module 34a consists of two spaced struts 38a and 38b forming the base of the module and two substantially inverted T-shaped members 40a and 40b at the respective ends of the struts. Since the module 34a is preferably formed of a molded plastic, the T-shaped members 40a and 40b are molded integrally with the struts 38a and 38b. In the mounted position of the module 34a, the connector 36a extends between the struts 38a and 38b of the module in a frictional fit.

Four threaded posts 42a–42d are attached to the circuit board 14 and project upwardly from the circuit board adjacent the connector 36a. In the mounted position of the retention module 34a, the posts 42a–42d extend through corresponding openings in the members 40a and 40b of the retention module, and each member 40a and 40b carries two nuts for engaging two of the corresponding posts 42a–42d, all in a manner to be described. It is understood that the module 34b is identical to the module 34a and therefore will not be described in detail.

Figure 3:
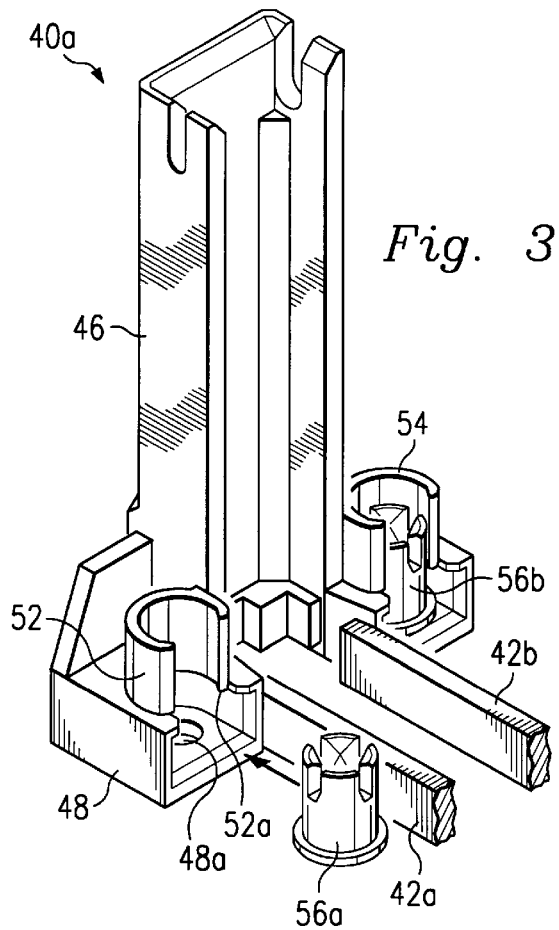
FIG. 3 is an enlarged, partial isometric view showing an assembly step.

FIG. 3 depicts the retention module 34a, and therefore the member 40a 1, rotated approximately 180 degrees from its position in FIG. 2 for the convenience of presentation. The member 40a is formed by an elongated, upright, member 46, having a U-shaped cross-section extending upwardly from a base 48, as viewed in FIG. 3. Two openings, one of which is shown by the reference numeral 48a, are provided through the base 48 to either side of the member 46 for receiving the posts 42a and 42b, respectively (FIG. 2).

Two substantially barrel-shaped retention members 52 and 54 are molded to the upper surface of the base 48, with the member 52 extending immediately above the opening 48a and the member 54 extending immediately above the other opening (not shown) in the base 48. The retention members 52 and 54 receive the nuts 56a and 56b, respectively, with the nut 56b being shown within the retention member 54 in FIG. 3, and the nut 56a is shown just prior to insertion in the member 52 in the direction indicated by the arrow. Each retention member 52 and 54 has a substantially C-shaped cross section, thus defining an space between its respective ends through which its corresponding nut 56a and 56b is inserted. These spaces are slightly less that the diameters of the corresponding nuts 56a and 56b so that the end portions of each retention member 52 and 54 flex outwardly to receive the corresponding nut when the nut is forced into the retention member in a direction indicated by the arrow in FIG. 3, and then flex, or "snap" inwardly back to their original position. This retains each nut 56a and 56b against movement in a direction perpendicular to the axis of the nut, or in a direction opposite the direction indicated by the arrow in FIG. 3.

Figure 4:
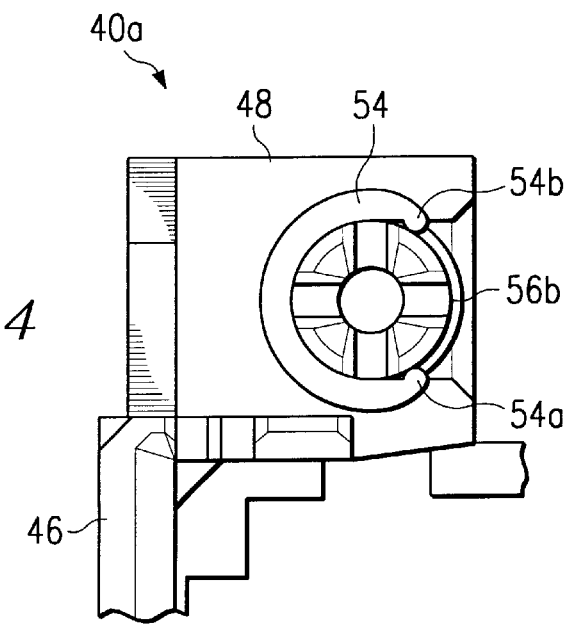
FIG. 4 is a top plan view of a portion of the retention module of FIGS. 2 and 3.

As shown in FIG. 4, the inner surfaces of the end portions 54a and 54b of the retention member 54 are enlarged to increase the abovementioned flex action when the nut 56a is inserted in the member to retain the nut in the member. It is understood that the retention member 52 is also provided with identical, enlarged end portions.

The diameters of the nuts 56a and 56b are slightly less that the corresponding cross-sections of the retention members 52 and 54, respectively, so that the nuts can rotate freely when retained in the retention members. As better shown in connection with the nut 56a in FIG. 3, a circular flange 56a' is formed on the lower end of the nut 56a which engages the lower end, or lip 52, of the retention member 52 to prevent the nut from escaping the retention member in an axial, upwardly direction, as viewed in the drawing. It is understood that the retention members 52 and 54 are identical, the nuts 56a and 56b are identical, the members 40a and 40b are identical, and the modules 34a and 34b are identical.

In operation, the nuts 56a and 56b are inserted in the retention members 52 and 54 of the T-shaped member 40a of the retention module 34a in the manner described above, and nuts identical to the nuts 56a and 56b are inserted in corresponding retention members associated with the T-shaped member 40b (FIG. 2). The retention module 34a is then lowered over the connector 36a and the threaded posts 42a–42d on the circuit board 14 until the lower surface of the module engages the upper surface of the board. In this position the connector 36a extends between the struts 38a and 38b of the member 40a; and the threaded posts 42a–42d extend through the openings in the member 40a, including the opening 48a (FIG. 3), as well as the openings in the member 40b. The design is such that, in this position, the nuts 56a and 56b, as well as the nuts associated with the member 40b, are located just above, and in alignment with, their respective posts 40a–40d.

Figure 5:
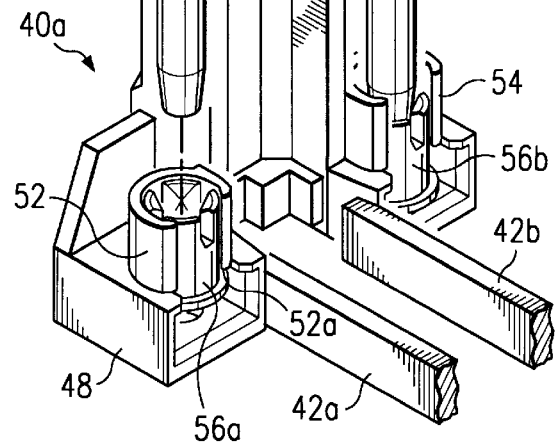
FIG. 5 is an enlarged, partial isometric view showing another assembly step.

With reference to FIG. 5, drive units 60a and 60b are then used to apply a sufficient amount of torque to the nuts, including the nuts 56a and 56b, to tighten the nuts over their corresponding posts 42a–42d and secure the retention module 34a to the circuit board 14. It is understood that the retention module 34b is attached to the circuit board 14 in an identical manner.

A cartridge module (not shown) containing a processor module is inserted in each retention module 34a and 34b prior to, or after, the retention modules 34a and 34b are installed on the circuit board 14 in the manner described above. To this end, the upper end portion of the members 40a and 40b are provided with notches to receive the cartridge module. In the installed position of the microprocessors, the connectors 36a and 36b engage corresponding connectors on the microprocessor modules to electrically connect the microprocessor modules to the circuit board 14.

Several advantages result from the foregoing. For example, the nuts will be properly aligned with their respective threaded posts, thus assuring that the nuts can be easily torqued-down over the posts. Also, the retention module has fewer components thus reducing costs and lowering the risk for components being unavailable or out of specification. Further, the retention module and the method of the present invention requires less labor, resulting in another cost savings while increasing production speed and reducing damage. Still further, the retention members keep the drive units from slipping off the nuts once the set torque limit has been reached.

It is understood that variations may be made in the foregoing without departing from the scope of the invention. For example, the embodiment described above is not limited to use with a desktop computer as described above by means of example, but is equally applicable to any type of self-contained computer, such as laptop computers, notebook computers, and the like. Also, any number of microprocessor modules can be mounted and used within the scope of the present invention. Further, the embodiment described above is not limited to any specific number of mounting posts, nuts, and retention modules, nor the number of base members and upright members forming the retention modules.

It is also understood that the embodiment of the module of the present invention described above is intended to illustrate rather than limit the invention, and that the mounting module can take many other forms and embodiments within the scope of the invention.

What is claimed is:

1. A retention module for receiving and mounting a microprocessor module to a computer chassis; the retention module comprising:

a base member for mounting to the chassis; and a retention member formed integrally with the base member, the retention member being substantially C-shaped in cross section and defining an opening between the respective ends of the retention member for receiving a nut, wherein the end portions of the retention member flex outwardly to receive the nut and then flex inwardly to retain the nut within the retention member, and wherein the retention member aligns the nut with a post on the chassis for permitting the nut to be threadedly connected to the post, thereby connecting the retention module to the chassis.

2. The module of claim 1 wherein the retention module further comprises an upright member extending from the base member for receiving a cartridge module containing the microprocessor module.

3. The module of claim 1 further comprising a circuit board mounted on the chassis from which the post projects, and wherein an opening extends through the base member for receiving the post.

4. The module of claim 3 further comprising a connector disposed on the circuit board for electrically connecting the microprocessor module to the circuit board, and wherein the retention module further comprises two spaced struts extending from the base member, the connector extending between the struts when the module is connected to the circuit board.

5. The module of claim 4 wherein there are two base members extending from the respective ends of the struts.

6. The module of claim 3 wherein there are two posts projecting from the circuit board and two openings extending through the base member to either side of the upright member for respectively receiving the posts, and wherein the retention module comprises two retention members for respectively receiving two nuts for respectively engaging the two posts.

7. A computer comprising:
   a chassis;
   a microprocessor module; and
   a retention module for receiving and mounting the microprocessor module to the chassis;
   the retention module comprising:
      (i) a base member for mounting to the chassis; and
      (ii) a retention member formed integrally with the base member, the retention member being substantially C-shaped in cross section and defining an opening between the respective ends of the retention member for receiving a nut, wherein the end portions of the retention member flex outwardly to receive the nut and then flex inwardly to retain the nut within the retention member, and wherein the retention member aligns the nut with a post on the chassis for permitting the nut to be threadedly connected to the post, thereby connecting the retention module to the chassis.

8. The computer of claim 7 wherein the retention module further comprises an upright member extending from the base member for receiving a cartridge module containing the microprocessor module.

9. The computer of claim 7 further comprising a circuit board mounted on the chassis from which the post projects, and wherein an opening extends through the base member for receiving the post.

10. The computer of claim 9 further comprising a connector disposed on the circuit board for electrically connecting the microprocessor module to the circuit board, and wherein the retention module further comprises two spaced struts extending from the base member, the connector extending between the struts when the module is connected to the circuit board.

11. The computer of claim 10 wherein there are two base members extending from the respective ends of the struts.

12. The computer of claim 9 wherein there are two posts projecting from the circuit board and two openings extending through the base member to either side of the upright member for respectively receiving the posts, and wherein the retention module comprises two retention members for respectively receiving two nuts for respectively engaging the two posts.

13. A computer comprising:
   a chassis;
   a microprocessor module disposed in the chassis; and
   a retention module for receiving and mounting the microprocessor module to the chassis, the retention module including:
      (i) a base member for mounting to the chassis;
      (ii) a retention member formed integrally with the base member, wherein the retention member is substantially C-shaped in cross section and defines an opening between the respective end portions of the retention member; and
      (iii) a nut for inserting into the retention member through the opening, wherein the end portions of the retention member flex outwardly to receive the nut and then flex inwardly to retain the nut within the retention member, and wherein a circular flange is formed on an end of the nut having a diameter greater than that of the retention member to prevent axial movement of the nut relative to the retention member;
   the nut rotating to engage a post on the chassis to mechanically connect the retention module to the chassis.

14. The computer of claim 13 wherein the retention module further comprises an upright member extending from the base member for receiving the microprocessor module.

15. The computer of claim 13 further comprising a circuit board mounted on the chassis from which the post projects, and wherein an opening extends through the base member for receiving the post.

16. The computer of claim 15 further comprising a connector disposed on the circuit board for electrically connecting the microprocessor module to the circuit board, and wherein the retention module further comprises two spaced struts extending from the base member, the connector extending between the struts when the module is connected to the circuit board.

17. A retention module for receiving and mounting the microprocessor module to the chassis, the retention module comprising:
   a base member for mounting to the chassis;
   a retention member formed integrally with the base member, the retention member being substantially C-shaped in cross section and defining an opening between the respective ends of the retention member; and
   a nut for inserting into the retention member through the opening, and having a circular flange formed on an end of the nut with a diameter greater than that of the retention member to prevent axial movement of the nut from the retention member, wherein the retention member ends flex for receiving and retaining the nut, and the retention member aligns the nut with a post on the chassis for permitting the nut to be threadedly connected to the post, thereby connecting the retention module to the chassis.

18. A computer comprising:
   a chassis;
   a microprocessor module; and a retention module for receiving and mounting the microprocessor module to the chassis;

the retention module comprising:
(i) a base member for mounting to the chassis; and
(ii) a retention member formed integrally with the base member, the retention member being substantially C-shaped in cross section and defining an opening between the respective ends of the retention member;
(iii) a nut for inserting into the retention member through the opening, and having a circular flange formed on an end of the nut with a diameter greater than that of the retention member to prevent axial movement of the nut from the retention member, wherein the retention member ends flex for receiving and retaining the nut, and the retention member aligns the nut with a post on the chassis for permitting the nut to be threadedly connected to the post, thereby connecting the retention module to the chassis.

19. A method for installing a microprocessor module in a computer chassis, the method comprising the steps of:

providing a retention module having a base, attaching the base to the chassis, molding to the base a retention member having a substantially C-shaped cross section and defining an opening between its respective end portions, inserting a nut into the retention member through the opening to flex the end portions of the retention member outwardly to receive the nut and then to allow the end portions to flex inwardly to retain the nut within the retention member, and rotating the nut to threadedly connect the nut to a post on the computer chassis.

20. The method of claim 19 wherein the end portions limit the movement of the nut in a direction perpendicular to the axis of the nut, and further comprising the step of limiting the axial movement of the nut.

21. The method of claim 19 further comprising the step of electrically connecting the microprocessor module to a circuit board disposed in the chassis.

* * * * *